(12) United States Patent
Xin et al.

(10) Patent No.: US 7,757,149 B2
(45) Date of Patent: Jul. 13, 2010

(54) BROADCAST MESSAGE PASSING DECODING OF LOW DENSITY PARITY CHECK CODES

(76) Inventors: Weizhuang Xin, 3 Elderwood, Aliso Viejo, CA (US) 92656; Chien-Hsin Lee, 1296 Freswick Dr., Folsom, CA (US) 95630

( * ) Notice: Subject to any disclaimer, the term of this patent is extended or adjusted under 35 U.S.C. 154(b) by 771 days.

(21) Appl. No.: 11/249,758

(22) Filed: Oct. 12, 2005

(65) Prior Publication Data
US 2007/0083802 A1   Apr. 12, 2007

(51) Int. Cl.
*H03M 13/00* (2006.01)
(52) U.S. Cl. ............. 714/752; 708/531; 711/E12.034; 398/66; 370/312; 370/390
(58) Field of Classification Search ............ 714/752; 708/531; 711/E12.034; 398/66; 370/312, 370/390
See application file for complete search history.

(56) References Cited

U.S. PATENT DOCUMENTS

| | | | |
|---|---|---|---|
| 6,539,367 B1 * | 3/2003 | Blanksby et al. ............. 706/14 |
| 6,584,101 B2 * | 6/2003 | Hagglund et al. ........... 370/389 |
| 6,633,856 B2 | 10/2003 | Richardson et al. .......... 706/15 |
| 6,751,770 B2 | 6/2004 | Morelos-Zaragoza ....... 714/781 |
| 6,829,308 B2 * | 12/2004 | Eroz et al. ................... 375/271 |
| 2002/0002695 A1 | 1/2002 | Kschischang et al. ....... 714/794 |
| 2002/0154712 A1 | 10/2002 | Cideciyan et al. ........... 375/341 |
| 2003/0023917 A1 | 1/2003 | Richardson et al. ......... 714/749 |
| 2004/0034828 A1 | 2/2004 | Hocevar ..................... 714/800 |
| 2004/0057575 A1 | 3/2004 | Zhang et al. ........... 379/399.02 |
| 2004/0153960 A1 | 8/2004 | Eroz et al. ................... 714/800 |
| 2005/0166132 A1 * | 7/2005 | Shen et al. .................. 714/801 |
| 2005/0204271 A1 * | 9/2005 | Sharon et al. ............... 714/801 |
| 2005/0204272 A1 * | 9/2005 | Yamagishi .................. 714/801 |
| 2008/0215950 A1 * | 9/2008 | Shen et al. .................. 714/755 |

\* cited by examiner

*Primary Examiner*—Scott T Baderman
*Assistant Examiner*—Enam Ahmed
(74) *Attorney, Agent, or Firm*—Dorsey & Whitney LLP

(57) ABSTRACT

Decoding by passing messages back and forth between a set of variable nodes and a set of check nodes, where at least one of the nodes broadcasts the same message to each of its associated nodes, is provided. For example, the variable nodes can broadcast and the check nodes can provide individual messages. Alternatively, the check nodes can broadcast and the variable nodes can provide individual messages. As another alternative, the variable nodes and the check nodes can both broadcast to their associated nodes. Broadcasting reduces the number of interconnections required between variable nodes and check nodes. Broadcasting is enabled by providing local storage within the nodes and/or by providing extra processing steps within the nodes.

23 Claims, 5 Drawing Sheets

402 — Initialize: $L_{mn}^{(0)} = 0$
$L_n^0 = 2y_n/\sigma^2$
$i = 0$

404 — In variable nodes:
if $i \geq 1$: $L_{mn}^{(i)} = \phi\left(\left|W_m^{(i)}\right| - \phi\left(\left|Z_{mn}^{(i)}\right|\right)\right)\text{sgn}\left(W_m^{(i)}\right)\text{sgn}\left(Z_{mn}^{(i)}\right)$
$i = i + 1$
$Z_{mn}^{(i)} = L_n^0 + \sum_{m' \in M(n)\setminus m} L_{m'n}^{(i-1)}$
store $Z_{mn}^{(i)}$ in variable nodes
pass $Z_{mn}^{(i)}$ to check nodes 406 — In check nodes:
check parity
$W_m^{(i)} = \phi\left(\sum_{n \in N(m)} \phi\left(\left|Z_{mn}^{(i)}\right|\right)\right) \prod_{n \in N(m)} \text{sgn}\left(Z_{mn}^{(i)}\right)$
broadcast $W_m^{(i)}$ to variable nodes

BROADCAST MESSAGE PASSING DECODING OF LOW DENSITY PARITY CHECK CODES

FIELD OF THE INVENTION

This invention relates to decoding of low density parity check codes.

BACKGROUND

Coding is often used to reduce communication errors by deliberately introducing redundancy into a transmitted signal. When the signal is received, the redundancy introduced by the code can be used to detect and/or reduce errors. For example, a simple parity check code is obtained by transmitting blocks of N+1 bits, where N bits are data bits and one bit is a parity bit selected to make the parity of each N+1 bit block even. Such a code can provide detection, but not correction, of single bit errors. Introduction of more than one parity bit can improve code error reduction performance (e.g. by providing detection and/or correction of multiple bit errors). This code is an example of a block parity check code.

Block parity check codes can be considered more systematically in terms of a parity check matrix H. The matrix H has R rows and C columns, where $C \geq R$. Transmitted code words x, where x is a row vector, are in the null space of H (i.e., $Hx^T=0$). Thus the columns of H correspond to symbols in the code word x (typically binary bits), and each row of H corresponds to a parity check condition on the code word x. Since a transmitted code word has C bits subject to R linear conditions, the data content of a code word is C−R bits if the rows of H are linearly independent. In some cases, the rows of H are not linearly independent, and in these cases the data content of a block is C−R*, where R* is the number of linearly independent rows of H (i.e., the dimension of the row space of H). When the rows of H are not linearly independent, H is transformed to an equivalent matrix H' having linearly independent rows for encoding. However, the original H matrix is still used for decoding. The rate of a block code is the ratio (C−R*)/C, and is a measure of the amount of redundancy introduced by the code. For example, a rate ½ code has one parity bit for each data bit in a block, and a rate ¾ code has one parity bit for each three data bits in a block.

A parity check code is completely defined by its parity check matrix H. Accordingly, encoding can be regarded as the process of mapping a sequence of data bits to code words in the null space of H. This encoding is typically done by constructing a generator matrix G from H such that a message vector u is mapped into a code word x in the null space of H via x=uG. Methods for constructing G given H are known in the art. For example, if H has linearly independent rows and has the form [A|I] where A has dimensions n−k by k and I is an n−k dimensional identity matrix, G has the form $[I|-A^T]$. If H does not have this special form, G can still be constructed, but will not have the form $[I|-A^T]$ Similarly, decoding can be regarded as the process of estimating which code word was transmitted, given a received vector x' which need not be in the null space of H due to transmission errors. Various methods for efficiently performing these encoding and decoding operations in practice have been developed over time.

In the course of this development, low density parity check (LDPC) codes have emerged as an especially interesting class of codes. The defining characteristic of an LDPC code is that the parity check matrix H is sparse (i.e., is mostly zeros). It is customary to use the notation LDPC(B, D) to refer to an LDPC code, where B is the total number of bits in a block, and D is the number of data bits in a block. Thus such a code has a parity check matrix H having B columns and B−D rows (if the rows are linearly independent) or more than B−D rows (if the rows are linearly dependent). Some LDPC codes are referred to as "regular" codes because they have the same number $d_c$ of non-zero elements in every row of H and have the same number $d_v$ of non-zero elements in every column of H. Such codes are often referred to as $(d_v, d_c)$ LDPC codes. For example, a (3, 6) LDPC code has $d_v=3$ and $d_c=6$. In some cases, further structure has been imposed on H in order to improve encoding and/or decoding efficiency and/or, more commonly, to enhance coding gain. For example, it is generally preferred for no two rows (or columns) of the H matrix to have more than one "1" in common.

The structure of regular LDPC codes can be appreciated more clearly in connection with a graph, as shown on FIG. 1. In the representation of FIG. 1, a set of variable nodes 110 and a set of check nodes 120 are defined. The variable nodes and check nodes together make up a set of code nodes. Each variable node is associated with $d_v$ check nodes, and each check node is associated with d, variable nodes. In the example of FIG. 1, $d_v=3$, $d_c=6$, and the connections from variable nodes to check nodes are not completely shown to preserve clarity. There is one variable node for each bit in a code word (i.e., there are C variable nodes), and there is one check node for each parity check condition defined by H (i.e., there are R check nodes). It is useful to define N(m) as the set of variable nodes connected to check node m, and M(n) as the set of check nodes connected to variable node n.

LDPC decoding can be regarded as a process of estimating values for the variable nodes given received variable data (which may have errors) subject to parity check conditions defined by each check node. Belief propagation algorithms are commonly employed to decode LDPC codes.

FIG. 2 shows a typical belief propagation decoding method, where a Gaussian noise channel is assumed. Step 202 is initialization of check messages $L_{mn}$ and variable node initial values $L_n$. Step 204 shows variable node processing, where variable messages $Z_{mn}$ are calculated and passed to each associated check node. Step 206 shows check node processing, where check messages $L_{mn}$ are calculated and passed to each associated variable node. Messages are passed back and forth between the variable nodes and check nodes (i.e., steps 204 and 206 are repeated in sequence) until a termination condition is satisfied. Various termination conditions are used in practice (e.g., a predetermined maximum number of iterations is reached, or all parity checks are satisfied). Here $\phi(z)$ is given by $\phi(z)=-\ln(\tan h(z/2))$. The example of FIG. 2 shows a logarithmic belief propagation method (i.e., the computations are expressed in terms of $\phi(z)$). Belief propagation decoding can also be performed non-logarithmically (e.g., as in the original LDPC code work by Gallagher).

Various modifications of the basic belief propagation method of FIG. 2 have been employed to reduce the hardware and/or software resources required for decoding. For example, the summations in steps 204 and/or 206 can be restricted to the dominant term (or first several dominant terms) in the sum to reduce computation time. US 2003/0023917 considers use of an alternative message format where mathematically equivalent check node and variable node processing can be performed with relatively simple mathematical operations, such as additions and subtractions. US 2002/0002695 also considers an alternative message format to simplify node processing. US 2004/0057575 considers LDPC codes constructed to be relatively easy to encode and decode.

However, there are other resources required by conventional belief propagation decoding than considered in the preceding references. In particular, passing the messages can require significant resources. More specifically, in a hardware implementation of conventional belief propagation decoding, electrical connections are required between each check node and its associated set of variable nodes, and between each variable node and its associated set of check nodes. Conventional belief propagation decoding has individual output messages from each node (i.e., each node k sends a different message to each of a set of nodes associated with node k). The number of variable nodes and check nodes can be quite large in practice (e.g., a typical code can have several hundred to several thousand nodes). Because of this large number of nodes, the individual interconnections between nodes required by conventional belief propagation decoding can undesirably consume a large fraction of integrated circuit chip area.

Accordingly, it would be an advance in the art to provide message passing LDPC decoding that has less burdensome interconnection requirements.

SUMMARY

The invention provides decoding by passing messages back and forth between a set of variable nodes and a set of check nodes, where at least one of the nodes broadcasts the same message to each of its associated nodes. For example, the variable nodes can broadcast and the check nodes can provide individual messages. Alternatively, the check nodes can broadcast and the variable nodes can provide individual messages. As another alternative, the variable nodes and the check nodes can both broadcast to their associated nodes. Broadcasting reduces the number of interconnections required between variable nodes and check nodes. Broadcasting is enabled by providing local storage within the nodes and/or by providing extra processing steps within the nodes.

DETAILED DESCRIPTION

Figure 1:
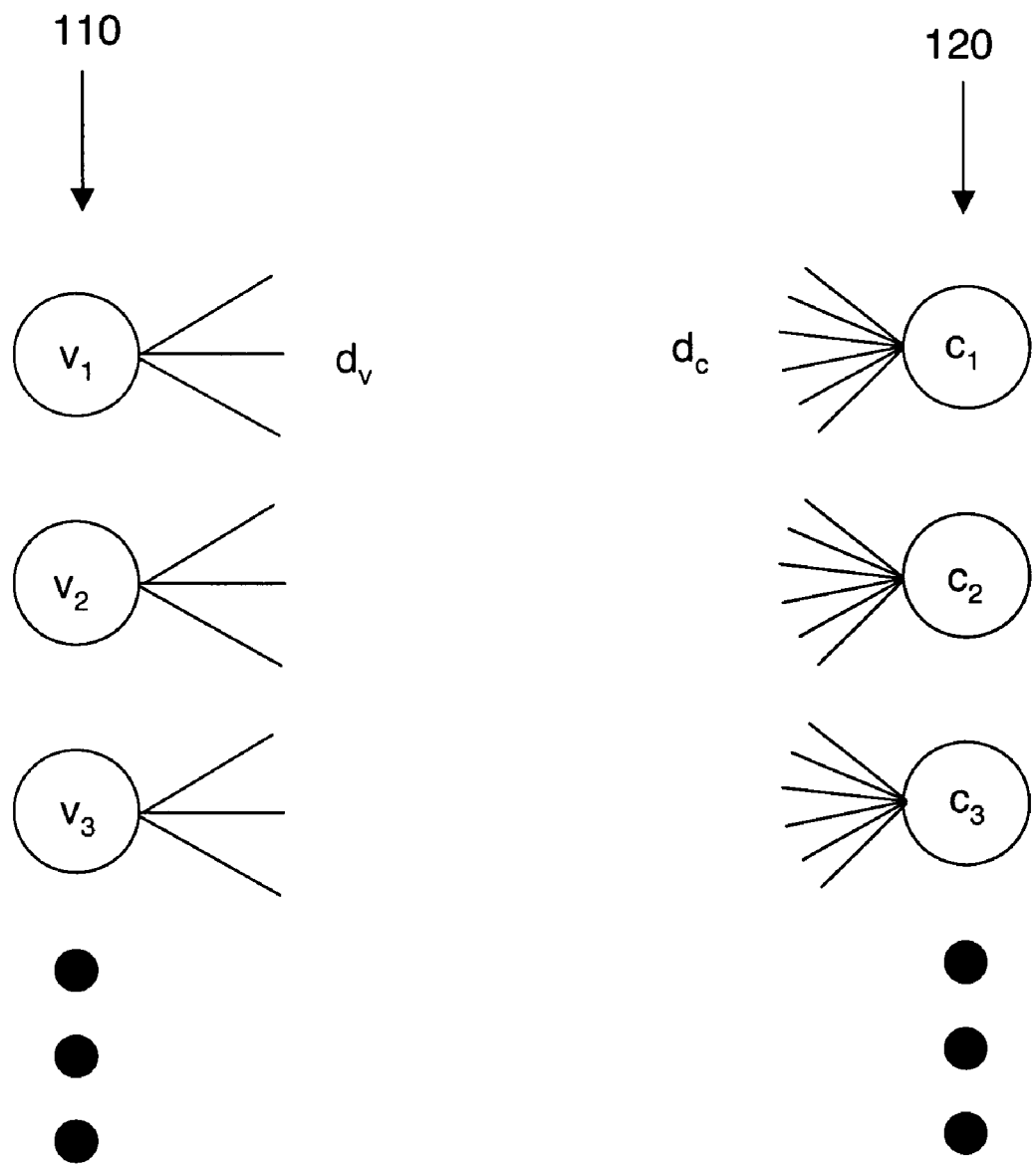
FIG. 1 shows variable nodes and check nodes of an exemplary LDPC code.

As indicated above, conventional belief propagation decoding of LDPC codes can require a large number of physical connections between variable nodes and check nodes for message passing. For example, consider a regular LDPC (2048, 1723) code having $d_v=6$ and $d_c=32$ (i.e., each variable node is associated with 6 check nodes, and each check node is associated with 32 variable nodes). The code of this example has 2048 variable nodes and 384 check nodes. The number of distinct messages from the variable nodes to the check nodes is 2048*6=12,288, and the number of distinct messages from the check nodes to the variable nodes is 384*32=12,288. The total number of distinct messages for conventional belief propagation in this example is 24,576. Since each distinct message requires a separate physical connection in hardware, a correspondingly large number of separate physical connections is required.

According to the present invention, the number of physical connections required for message passing decoding is reduced by broadcasting messages from the variable nodes and/or the check nodes. A variable node broadcasts the same message to each of its associated check nodes (and/or vice versa). Note that in conventional belief propagation decoding, each variable node sends a different message to each of its associated check nodes, and similarly for the check nodes. Since a broadcast message can be transmitted to multiple associated code nodes on a single physical connection (e.g., a single integrated circuit wire connection), such broadcasting advantageously reduces the number of required physical interconnections. In the preceding example, broadcasting the variable node messages reduces the total number of distinct messages to 2048+12,288=14,336 (42% reduction). Broadcasting the check node messages reduces the total number of distinct messages to 384+12,288=12,672 (48% reduction). Finally, broadcasting both the variable node messages and the check node messages reduces the total number of distinct messages to 2048+384=2432 (90% reduction). Such reduction in the number of distinct messages to be passed can provide a corresponding and advantageous reduction in the number of separate physical connecting elements (e.g. wires) required. For example, a single wire connected to multiple nodes can provide a broadcast messages to the multiple nodes.

In the following description, three exemplary embodiments of the invention are considered. In the first embodiment, the variable nodes broadcast and the check nodes pass individual messages. In the second embodiment, the check nodes broadcast and the variable nodes pass individual messages. In the third embodiment, both variable nodes and check nodes broadcast. Performance equivalence of these three methods to conventional belief propagation has been observed in simulation. Although specific algorithms and equations are given in the following examples for illustrative purposes, the invention broadly relates to any message passing decoder or decoding method where one or more of the code nodes broadcasts the same message to all of its associated code nodes. Thus the invention is not limited to incidental details given in the following description.

In the following examples, an additive white Gaussian noise channel is assumed having variance $\sigma^2$. Transmitted bits $c_n$ drawn from the set $\{0, 1\}$ are mapped to transmitted symbols $x_n=(-1)^{c_n}$ for transmission in N-bit blocks, where the index n runs from 1 to N. The received values $y_n$ are Gaussian random variables with mean $x_n$ and variance $\sigma^2$. The log-likelihood ratio (LLR) for bit n, $L_n^0$, is defined via $$L_n^0 = \log\left(\frac{p(y_n \mid c_n = 0)}{p(y_n \mid c_n = 1)}\right).$$

Here $p(y_n|c_n=0)$ is the conditional probability of receiving $y_n$ given $c_n=0$ and $p(y_n|c_n=1)$ is the conditional probability of receiving $y_n$ given $c_n=1$. From the preceding assumptions, $L_n^0=2y_n/\sigma^2$.

Figure 3:
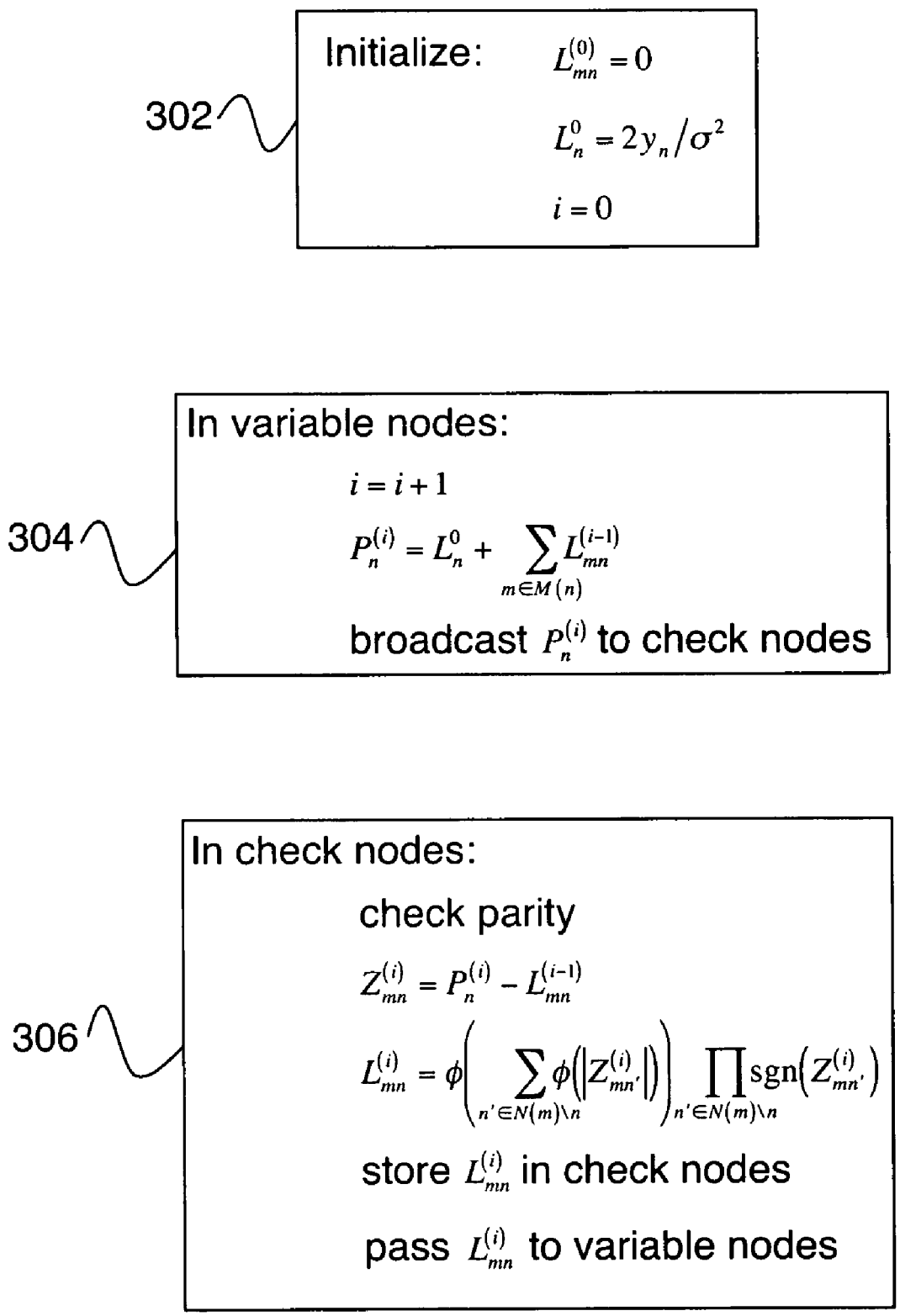
FIG. 3 shows message passing decoding according to a first embodiment of the invention.

FIG. 3 shows message passing decoding according to a first embodiment of the invention. Step 302 shows initialization, where the LLR values $L_n^0$ are set as indicated above and an iteration counter is set to zero. Initialization also includes setting initial check messages $L_{mn}^{(0)}$ to zero. The notation $L_{mn}^{(i)}$ refers to the check message passed from check node m to variable node n during the ith iteration of decoding.

Step 304 is variable node processing. In the variable nodes, the iteration counter i is incremented, and broadcast variable messages $P_n^{(i)}$ are calculated as indicated. The notation $P_n^{(i)}$ refers to the variable message broadcast from variable node n during the ith iteration of decoding, and the notation m∈M(n) refers to the set M(n) of check nodes associated with variable node n. The variable messages $P_n^{(i)}$ are then broadcast to the associated check nodes. Note that each variable node passes the same message to each of its associated check nodes, so this message passing is referred to as "broadcasting". A further benefit of this embodiment is that the broadcast variable messages $P_n^{(i)}$ are a posteriori LLRs, which allows for efficient parity check calculations in the check nodes without additional inputs to the check nodes.

Figure 2:
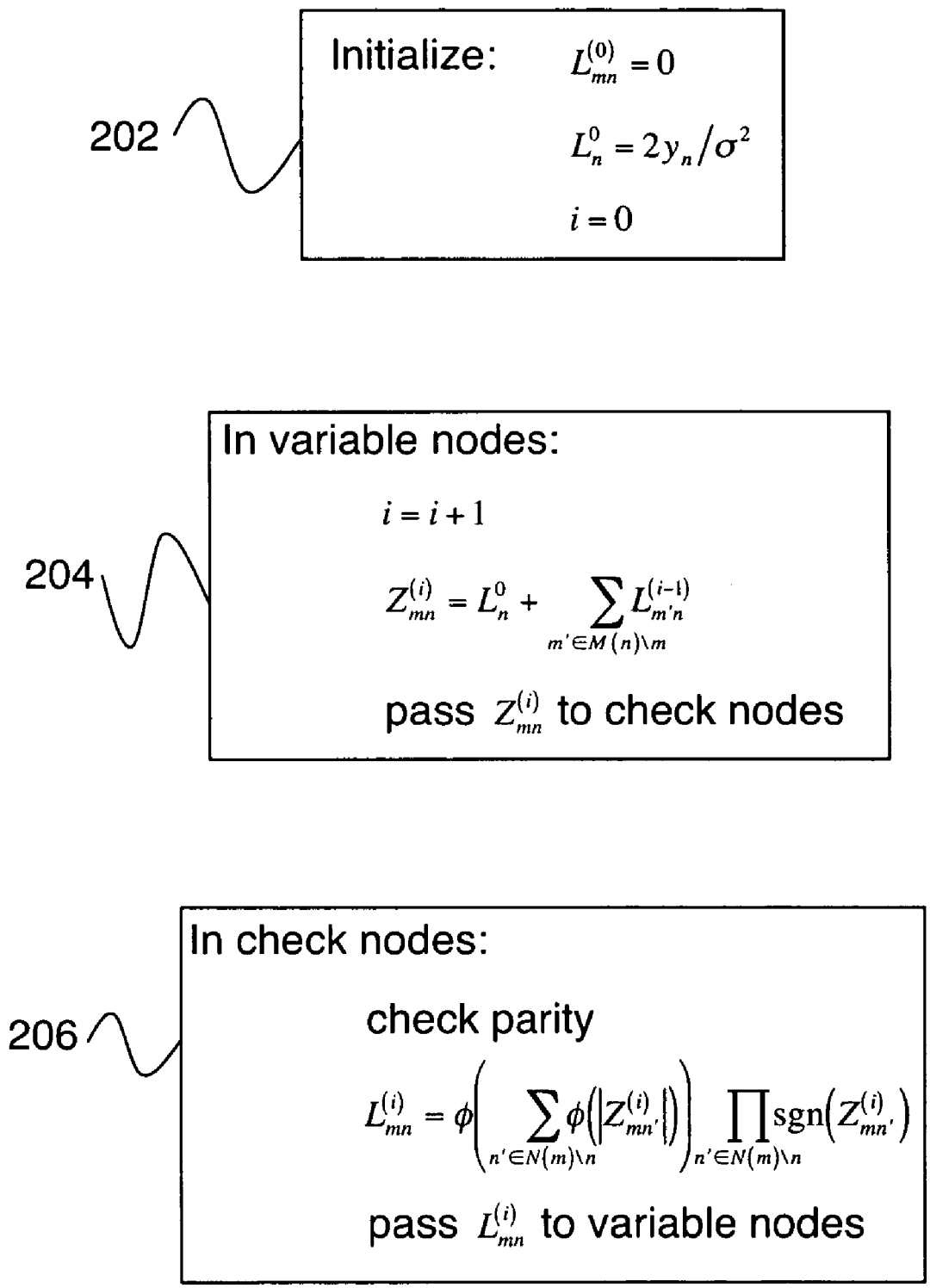
FIG. 2 shows conventional belief propagation decoding.

Step 306 is check node processing. The first step in check node processing is to check parity. More specifically, a row vector c can be formed having elements $c_n$ where $c_n=0$ if $P_n \geq 0$ and $c_n=1$ if $P_n<0$. If $Hc^T=0$, all parity checks are satisfied, and decoding can terminate. Any mathematically or logically equivalent method of checking parity is also suitable for practicing the invention. Otherwise, local variable messages $Z_{mn}^{(i)}$ are calculated as indicated. Comparison of FIGS. 2 and 3 shows that the local variable messages $Z_{mn}^{(i)}$ of step 306 of FIG. 3 are equivalent to the variable messages $Z_{mn}^{(i)}$ of step 204 of FIG. 2. Note that the notation m'∈M(n)\m refers to the set M(n) with check node m excluded. Then the check messages $L_{mn}^{(i)}$ are calculated from $Z_{mn}^{(i)}$ as indicated in step 306. Here φ(z) is given by φ(z)=−ln(tan h(z/2)). In practice, the function φ(z) is often approximated (e.g., by a lookup table). The check messages $L_{mn}^{(i)}$ are stored in the check nodes for use in the following decoding iteration. Therefore, each check node includes sufficient memory to store these messages (one message for every variable node N(m) associated with check node m). In the above example with $d_c=32$, each check node includes enough storage for 32 check messages. Finally, the check messages are passed to the variable nodes.

Steps 304 and 306 are repeated in sequence until a termination condition is satisfied. Various termination conditions can be employed, such as reaching a predetermined maximum number of iterations, or all parity checks being satisfied. The first two iterations proceed as follows: in variable nodes set i=1, calculate $P_n^{(1)}$ from $L_n^0$ and $L_{mn}^{(0)}$ broadcast $P_n^{(1)}$ to check nodes; in check nodes check parity, calculate $Z_{mn}^{(1)}$ from $P_n^{(1)}$ and $L_{mn}^{(0)}$, calculate $L_{mn}^{(1)}$, store $L_{mn}^{(1)}$, pass $L_{mn}^{(1)}$ to variable nodes; in variable nodes set i=2, calculate $P_n^{(2)}$ from $L_n^0$ and $L_{mn}^{(1)}$, broadcast $P_n^{(2)}$ to check nodes; in check nodes check parity, calculate $Z_{mn}^{(2)}$ from $P_n^{(2)}$ and $L_{mn}^{(1)}$, calculate $L_{mn}^{(2)}$, store $L_{mn}^{(2)}$ pass $L_{mn}^{(2)}$ to variable nodes. Since $L_{mn}^{(0)}$ is provided by the initialization of step 302, inputs for each calculation of the iteration are well-defined.

Figure 4:
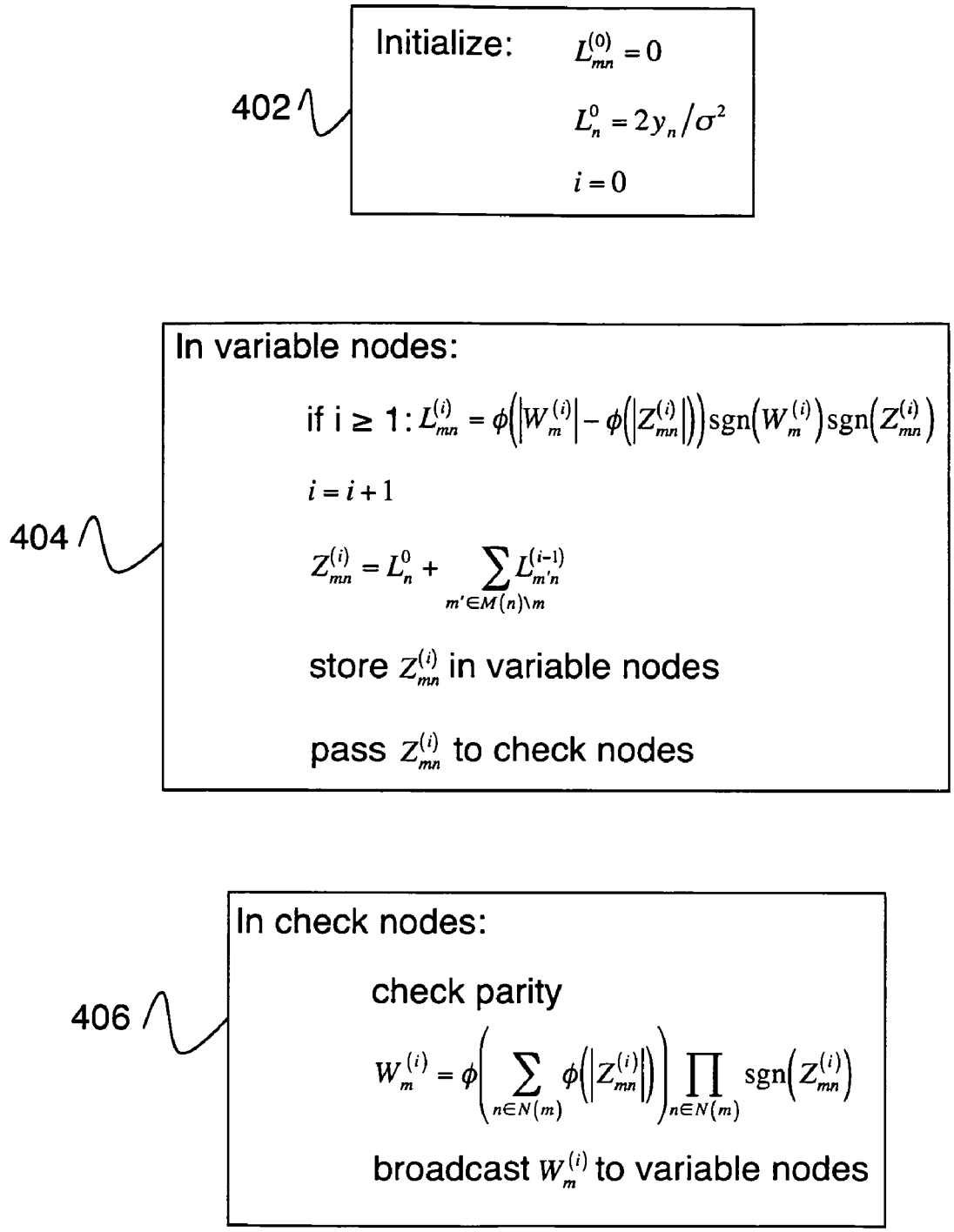
FIG. 4 shows message passing decoding according to a second embodiment of the invention.

FIG. 4 shows message passing decoding according to a second embodiment of the invention. Step 402 shows initialization, where the LLR values $L_n^0$ are set as indicated above and an iteration counter is set to zero. Initialization also includes setting initial local check messages $L_{mn}^{(0)}$ to zero. Here the notation $L_{mn}^{(i)}$ refers to the local check messages computed in the variable nodes during decoding iterations. As suggested by the notation, these local check messages are equivalent to the check messages of the conventional method of FIG. 2. Decoding proceeds by repeatedly performing steps 404 and 406 in sequence until a termination condition is satisfied.

Step 404 is variable node processing. The first step in the variable nodes is to calculate the local check messages $L_{mn}^{(i)}$. Here φ(z) is given by φ(z)=−ln(tan h(z/2)). For i=0, this calculation is not necessary, since the initialization of step 402 provides $L_{mn}^{(0)}$. Alternatively, initial values can be defined for $W_m^{(0)}$ and $Z_{mn}^{(0)}$ that make $L_{mn}^{(0)}$ zero (or approximately zero) in the calculation of step 404. For example, $W_m^{(0)}$ and $Z_{mn}^{(0)}$ can be initialized to $Z_{max}$, where $Z_{max}$ is a maximum positive value in a lookup table for calculating φ(z) and satisfies φ($Z_{max}$)≈0. Next the iteration counter i is incremented, and variable messages $Z_{mn}^{(i)}$ are calculated. The variable messages $Z_{mn}^{(i)}$ are stored in the variable nodes for use in the following decoding iteration. Therefore, each variable node includes sufficient memory to store these messages (one message for every check node M(n) associated with variable node n). In the above example with $d_v=6$, each variable node includes enough storage for 6 variable messages. Finally, the variable messages $Z_{mn}^{(i)}$ are passed to the check nodes, as are the hard decisions of each variable node (i.e., the sign of $P_n$ calculated as in 304 of FIG. 3) for use in parity checking.

Step 406 is check node processing. In the check nodes, parity is checked as described above. If all checks are not satisfied, decoding continues by calculating broadcast check messages $W_m^{(i)}$ as indicated and broadcasting these check messages to the variable nodes. Note that each check node passes the same message to each of its associated variable nodes, so this message passing is referred to as "broadcasting".

Steps 404 and 406 are repeated in sequence until a termination condition is satisfied. Various termination conditions can be employed, such as reaching a predetermined maximum number of iterations, or all parity checks being satisfied. The first two iterations proceed as follows: in variable nodes set i=1, calculate $Z_{mn}^{(1)}$ from $L_n^0$ and $L_{mn}^{(0)}$, store $Z_{mn}^{(1)}$, pass $Z_{mn}^{(1)}$ to check nodes; in check nodes check parity, calculate $W_m^{(1)}$ from $Z_{mn}^{(1)}$, broadcast $W_m^{(1)}$ to variable nodes; in variable nodes calculate $L_{mn}^{(1)}$ from $W_m^{(1)}$ and $Z_{mn}^{(1)}$, set i=2, calculate $Z_{mn}^{(2)}$ from $L_n^0$ and $L_{mn}^{(1)}$, store $Z_{mn}^{(2)}$, pass $Z_{mn}^{(2)}$ to check nodes; in check nodes check parity, calculate $W_m^{(2)}$ from $Z_{mn}^{(2)}$, broadcast $W_m^{(2)}$ to variable nodes. Since $L_{mn}^{(0)}$ is provided by the initialization of step 402 (or an equivalent alternative such as given above), inputs for each calculation of the iteration are well-defined. Comparison of FIGS. 2 and 4 shows that the local check messages $L_{mn}^{(i)}$ of step 404 of FIG. 4 are equivalent to the check messages $L_{mn}^{(i)}$ of step 206 of FIG. 2.

Figure 5:
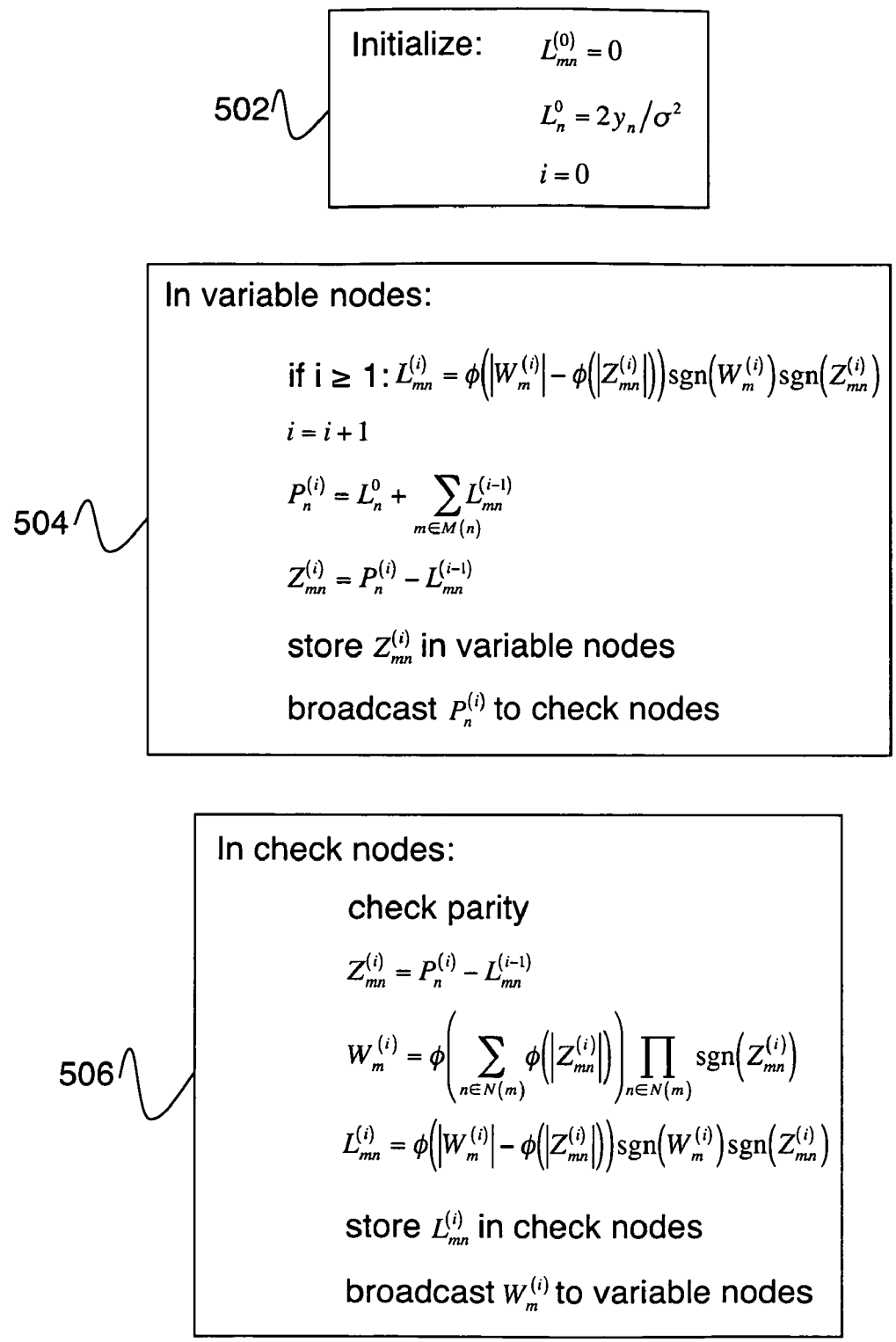
FIG. 5 shows message passing decoding according to a third embodiment of the invention.

FIG. 5 shows message passing decoding according to a third embodiment of the invention. Step 502 shows initialization, where the LLR values $L_n^0$ are set as indicated above and an iteration counter is set to zero. Initialization also includes setting initial local check messages $L_{mn}^{(0)}$ to zero. Here the notation $L_{mn}^{(i)}$ refers to the local check messages computed in the variable nodes and check nodes during decoding iterations. As suggested by the notation, these local check messages are equivalent to the check messages of the conventional method of FIG. 2. Similarly, $Z_{mn}^{(i)}$ refers to the local variable messages computed in the variable nodes and check nodes during decoding iterations. As suggested by the notation, these local variable messages are equivalent to the variable messages of the conventional method of FIG. 2. Decoding proceeds by repeatedly performing steps 504 and 506 in sequence until a termination condition is satisfied.

Step 504 is variable node processing. The first step in the variable nodes is to calculate the local check messages $L_{mn}^{(i)}$. Here φ(z) is given by φ(z)=−ln(tan h(z/2)). For i=0, this calculation is not necessary, since initialization provides $L_{mn}^{(0)}$. Alternative equivalent initializations (e.g., as considered above) can also be employed. Next, the iteration counter i is incremented, and broadcast variable messages $P_n^{(i)}$ are calculated. Next, local variable messages $Z_{mn}^{(i)}$ are calculated and stored in the variable nodes for use in the following decoding iteration. Therefore, each variable node includes sufficient memory to store these messages (one message for every check node M(n) associated with variable node n). In the above example with $d_v=6$, each variable node includes enough storage for 6 variable messages. Finally, the broadcast variable messages $P_n^{(i)}$ are broadcast to the check nodes. Note that each variable node passes the same message to each of its associated check nodes, so this message passing is referred to as "broadcasting".

Step 506 is check node processing. In the check nodes, parity is checked. If all parity checks are not satisfied, decoding continues by calculating local variable messages $Z_{mn}^{(i)}$. Then broadcast check messages $W_m^{(i)}$ and local check messages $L_{mn}^{(i)}$ are calculated. The check messages $L_{mn}^{(i)}$ are stored in the check nodes for use in the following decoding iteration. Therefore, each check node includes sufficient memory to store these messages (one message for every variable node N(m) associated with check node m). In the above example with $d_c=32$, each check node includes enough storage for 32 check messages. The broadcast check messages $W_m^{(i)}$ are broadcast to the variable nodes. Note that each check node passes the same message to each of its associated variable nodes, so this message passing is referred to as "broadcasting".

Steps 504 and 506 are repeated in sequence until a termination condition is satisfied. Various termination conditions can be employed, such as reaching a predetermined maximum number of iterations, or all parity checks being satisfied. The first two iterations proceed as follows: in variable nodes set i=1, calculate $P_n^{(1)}$ from $L_n^0$ and $L_{mn}^{(0)}$, calculate $Z_{mn}^{(1)}$ from $P_n^{(1)}$ and $L_{mn}^{(0)}$, store $Z_{mn}^{(1)}$, broadcast $P_n^{(1)}$ to check nodes; in check nodes check parity, calculate $Z_{mn}^{(1)}$ from $P_n^{(1)}$ and $L_{mn}^{(0)}$, calculate $W_m^{(1)}$ from $Z_{mn}^{(1)}$, calculate $L_{mn}^{(1)}$ from $W_m^{(1)}$ and $Z_{mn}^{(1)}$, store $L_{mn}^{(1)}$, broadcast $W_m^{(1)}$ to variable nodes; in variable nodes calculate $L_{mn}^{(1)}$ from $W_m^{(1)}$ and $Z_{mn}^{(1)}$ set i=2, calculate $P_n^{(2)}$ from $L_n^0$ and $L_{mn}^{(1)}$, calculate $Z_{mn}^{(2)}$ from $P_n^{(2)}$ and $L_{mn}^{(1)}$, store $Z_{mn}^{(2)}$ broadcast $P_n^{(2)}$ to check nodes; in check nodes check parity, calculate $Z_{mn}^{(2)}$ from $P_n^{(2)}$ and $L_{mn}^{(1)}$, calculate $W_m^{(2)}$ from $Z_{mn}^{(2)}$, calculate $L_{mn}^{(2)}$ from $W_m^{(2)}$ and $Z_{mn}^{(2)}$, store $L_{mn}^{(2)}$, broadcast $W_m^{(2)}$ to variable nodes. Since $L_{mn}^{(0)}$ is provided by the initialization of step 502 (or an equivalent alternative such as given above), inputs for each calculation of the iteration are well-defined. Comparison of FIGS. 2 and 5 shows that the local check and variable messages $L_{mn}^{(i)}$ and $Z_{mn}^{(i)}$ of FIG. 5 are equivalent to the check and variable messages $L_{mn}^{(i)}$ and $Z_{mn}^{(i)}$ FIG. 2.

As evident from the preceding description, the present invention can provide varying levels of reduction in message passing. For example, the method of FIG. 5 requires some duplicate calculations in order to provide broadcasting from both variable nodes and check nodes. In contrast, the methods of FIGS. 3 and 4 do not provide as much reduction in message passing as the method of FIG. 5, but they also do not require significantly more storage or computation than conventional decoding methods. Accordingly, preferred embodiments are expected to be application-dependent, since different applications dictate different trade-offs between node/processing complexity and interconnection complexity.

The preceding description provides examples of methods of the invention. Embodiments of the invention also include decoders that carry out methods of the invention. Such decoders can include processors for performing the method steps. Such processors can be implemented as any combination of hardware and/or software.

Many variations of the preceding examples also fall under the scope of the present invention. For example, the invention is applicable to simplified approximate belief propagation methods (e.g., where the sums on FIGS. 3-5 are restricted to the dominant term or a few largest terms). Messages can be passed in various formats, such as sgn(Z) together with φ(|Z|) for the variable messages Z. Preferably, the calculations are performed logarithmically, as in the examples, but the invention can also be practiced with non-logarithmic calculations.

What is claimed is:

1. A method for decoding a low density parity check code, the method comprising:
   initializing variable nodes of a decoder to have respective initial values, wherein each of the variable nodes is associated with a plurality of check nodes, and wherein each of the check nodes is associated with a plurality of the variable nodes;
   passing variable messages from each variable node to the check nodes associated with the respective variable node;
   passing check messages from each check node to the variable nodes associated with the respective check node, wherein during at least one of the acts of said passing variable messages or passing check messages, at least one of the check or variable nodes broadcasts a same message to a plurality of associated nodes over a single interconnection; and
   repeating said passing variable and check messages until a termination condition is satisfied.

2. The method of claim 1, wherein each variable node receives check messages from a plurality of associated check nodes and broadcasts the same message to each of the plurality of associated check nodes.

3. The method of claim 2, wherein said initializing variable nodes comprises initializing the variable nodes to have an initial value given as $L_n^0$;
   said repeating is indexed by an integer i;
   the plurality of associated check nodes associated with a respective variable node are represented as M(n);
   the check messages received by each variable node from the plurality of respective associated check nodes is represented as $L_{mn}^{(i-1)}$; and
   said same message is given by $$P_n^{(i)} = L_n^0 + \sum_{m \in M(n)} L_{mn}^{(i-1)}.$$

4. The method of claim 3, further comprising calculating local variable messages $Z_{mn}^{(i)}$ where $Z_{mn}^{(i)} = P_n^{(i)} - L_{mn}^{(i-1)}$ in each check node.

5. The method of claim 4, wherein:
   a function φ(z) is given by φ(z)=−ln(tan h(z/2)); the check messages $L_{mn}^{(i-1)}$ are given by for $$L_{mn}^{(i-1)} = \phi\left(\sum_{n' \in N(m) \backslash n} \phi(|Z_{mn'}^{(i-1)}|)\right) \prod_{n' \in N(m) \backslash n} sgn(Z_{mn'}^{(i-1)})$$

i≧2, where $_{mn}^{(0)}$=0; and
   the check nodes include memory for storing the check messages $L_{mn}^{(i-1)}$ from one iteration to a following iteration.

6. The method of claim 1, and wherein each check node receives variable messages from a plurality of associated variable nodes and broadcasts the same message to each of the plurality of associated variable nodes.

7. The method of claim 6, wherein:
   said repeating is indexed by an integer i;

the plurality of associated variable nodes associated with a respective variable node are represented as N(m);
a function $\phi(z)$ is given by $\phi(z)=-\ln(\tan h(z/2))$; and
the same message includes $W_m^{(i)}$ given by $$W_m^{(i)} = \phi\left(\sum_{n \in N(m)} \phi(|Z_{mn}^{(i)}|)\right) \prod_{n \in N(m)} sgn(Z_{mn}^{(i)}).$$

8. The method of claim 7, further comprising calculating local check messages $L_{mn}^{(i)}$ given by $L_{mn}^{(i)} = \phi(|W_m^{(i)}| - \phi(|Z_{mn}^{(i)}|))sgn(W_m^{(i)})sgn(Z_{mn}^{(i)})$, for $i \geq 1$ in each variable node, and wherein $L_{mn}^{(0)} = 0$.

9. The method of claim 8, wherein the variable messages $Z_{mn}^{(i)}$ are given by $$Z_{mn}^{(i)} = L_n^0 + \sum_{m' \in M(n) \setminus m} L_{m'n}^{(i-1)}$$

for $i \geq 1$, and wherein the variable nodes include memory for storing the variable messages $Z_{mn}^{(i)}$ from one iteration to a following iteration.

10. The method of claim 1 wherein:
said repeating is indexed by an integer i;
each variable node receives broadcast check messages from each of a plurality of associated check nodes and provides a same broadcast variable message to each of the plurality of associated check nodes; and
each check node receives the broadcast variable message and other variable messages broadcast from other variable nodes associated with each check node and provides a same broadcast check message to a plurality of associated variable nodes.

11. The method of claim 10;
local check messages $L_{mn}^{(i)}$ are calculated in each check node, and wherein the check nodes include memory for storing the local check messages $L_{mn}^{(i)}$ from one iteration to a following iteration; and
local variable messages $Z_{mn}^{(i)}$ are calculated in each variable node, and wherein the variable nodes include memory for storing the local variable messages $Z_{mn}^{(i)}$ from one iteration to a following iteration.

12. The method of claim 11, wherein the broadcast variable messages $P_n^{(i)}$ are given by $$P_n^{(i)} = L_n^0 + \sum_{m \in M(n)} L_{mn}^{(i-1)}.$$

13. The method of claim 12, wherein the local variable messages $Z_{mn}^{(i)}$ are given by $Z_{mn}^{(i)} = P_n^{(i)} - L_{mn}^{(i-1)}$ in each check node.

14. A method for decoding a low density parity check code in a system having check nodes and variable nodes, each check node associated with a respective plurality of the variable nodes, and each variable node associated with a respective plurality of check nodes, the method comprising:
calculating broadcast variable messages in each of the variable nodes;
broadcasting the respective broadcast variable message from each of the variable nodes to their respective associated plurality of the check nodes, such that a first variable node broadcasts a same broadcast variable message to each of the respective plurality of check nodes associated with the first variable node on a first interconnect between the first variable node and the respective plurality of check nodes;
receiving, at each check node, the respective broadcast variable messages from each of the associated plurality of variable nodes, such that a first check node associated with the first variable node receives a plurality of the broadcast variable messages including the same broadcast variable message;
calculating a plurality of check messages at each check node, wherein each of the plurality of check messages corresponds to a respective associated variable node, and wherein the check messages are based, at least in part, on the received broadcast variable messages, such that the first check node calculates a first check message for the first variable node and a second check message for a second variable node;
storing the respective calculated check messages at each check node; and
coupling the check messages from each check node to the respective associated variable nodes, such that the first check node couples the first check message to the first variable node on a second interconnect between the first check node and the first variable node and the first check node couples the second check message to the second variable node on a third interconnect between the first check node and the second variable node.

15. The method of claim 14 wherein said calculating a plurality of check messages is further based in part on stored check messages at the respective check node.

16. The method of claim 14 further comprising:
repeating said calculating broadcast variable messages, broadcasting, receiving, calculating a plurality of check messages, storing, and coupling, until a termination condition is satisfied.

17. A method for decoding a low density parity check code in a system having check nodes and variable nodes, wherein each check node is associated with a respective plurality of the variable nodes, and wherein each variable node is associated with a respective plurality of check nodes, the method comprising:
calculating a plurality of variable messages in each of the variable nodes, wherein each of the variable nodes is configured to calculate at least one variable message for each of the respective associated check nodes;
storing the plurality of variable messages at each of the variable nodes;
coupling the variable messages from each variable node to the respective associated check node, such that a first variable node couples a first variable message to a first check node on a first interconnect between the first variable node and the first check node and the first variable node couples a second variable message to a second check node on a second interconnect between the first variable node and the second check node;
receiving, at each check node, the respective variable messages from each of the associated plurality of variable nodes, such that a first check node associated with the first variable node receives a plurality of the variable messages including the first variable message;
calculating a respective broadcast check message at each check node, wherein the respective broadcast message is based, at least in part, on the received variable messages; and
broadcasting the respective broadcast check message from each of the check nodes to their respective associated variable nodes such that the first check node broadcasts a same broadcast variable message to each of the respective plurality of variable nodes associated with the first variable node on a third interconnect between the first check node and the respective plurality of variable nodes.

18. The method of claim 17 wherein the variable messages are based in part on variable messages stored at the respective variable node.

19. The method of claim 17 wherein the variable messages are based in part on received broadcast check messages.

20. A method for decoding a low density parity check code in a system having check nodes and variable nodes, wherein each check node is associated with a respective plurality of the variable nodes, and wherein each variable node is associated with a respective plurality of check nodes, the method comprising:

calculating a respective broadcast variable message in each of the variable nodes;

broadcasting the respective broadcast variable message from each of the variable nodes to their respective associated plurality of the check nodes such that a first variable node broadcasts a same broadcast variable message to each of the respective plurality of check nodes associated with the first variable node on a first interconnect between the first variable node and the respective plurality of check nodes;

calculating a plurality of local variable messages in each of the variable nodes, wherein each of the plurality of local variable messages corresponds to a different one of the associated check nodes, such that the first variable node calculates a first local variable message corresponding to a first one of the respective plurality of check nodes associated with the first variable node and a second local variable message corresponds to a second one of the respective plurality of check nodes associated with the first variable node;

storing the plurality of local variable messages at each of the respective variable nodes;

receiving, at each check node, the respective broadcast variable messages from each of the associated plurality of variable nodes such that the first one of the check nodes associated with the first variable node receives a plurality of the broadcast variable messages including the first broadcast variable message;

calculating a respective broadcast check message at each check node, wherein the respective broadcast message is based, at least in part on, the received broadcast variable messages;

broadcasting the respective broadcast check message from each of the check nodes to their respective associated variable nodes such that the first check node broadcasts a same broadcast variable message to each of the respective plurality of variable nodes associated with the first variable node on a second interconnect between the first check node and the respective plurality of variable nodes;

calculating a plurality of local check messages in each of the check nodes, wherein each of the plurality of local check messages corresponds to a different one of the associated variable nodes such that the first check node calculates a first local check message corresponding to a first one of the respective plurality of variable nodes associated with the first check node and a second local check message corresponds to a second one of the respective plurality of variable nodes associated with the first check node; and storing the local check messages at each of the respective check nodes.

21. A decoder for decoding low density parity check codes, the decoder comprising:

a plurality of variable nodes, wherein each of the plurality of variable nodes is configured to calculate a respective broadcast variable message and receive a plurality of check messages;

a plurality of check nodes, wherein each of the plurality of variable nodes is associated with a respective plurality of the check nodes, wherein each of the check nodes is associated with a respective plurality of the variable nodes, wherein each of the check nodes associated with a first variable node are configured to receive a same broadcast variable message calculated by the first variable nodes, wherein each of the check nodes associated with the first variable node are further configured to calculate a different check message for each of the associated plurality of variable nodes, wherein the different check messages are based, at least in part, on the received broadcast variable message, wherein each of the plurality of check nodes are further configured to store the different check messages, and wherein each of the plurality of check nodes includes memory having sufficient capacity to store the different check messages;

a first plurality of interconnects, wherein each of the first plurality of interconnects couple a respective variable node to the plurality of associated check nodes and are configured to carry a respective broadcast variable message; and a second plurality of interconnects, wherein each of the second plurality of interconnects couple a respective check node to a respective associated variable node and are configured to carry a respective different check message.

22. The method of claim 14, wherein each of the check nodes correspond to a respective parity check condition.

23. The method of claim 14, wherein each of the variable nodes correspond to a respective portion of received data.

* * * * *